United States Patent
Liu et al.

(10) Patent No.: US 11,313,931 B2
(45) Date of Patent: Apr. 26, 2022

(54) SYSTEM AND METHOD FOR QUANTIFYING T1, T2 AND RESONANCE FREQUENCY USING ROSETTE TRAJECTORY ACQUISITION AND READ SEGMENTED RECONSTRUCTION

(71) Applicant: Case Western Reserve University, Cleveland, OH (US)

(72) Inventors: Yuchi Liu, Cleveland, OH (US); Jesse Hamilton, Cleveland Heights, OH (US); Nicole Seiberlich, Shaker Heights, OH (US); Mark A. Griswold, Shaker Heights, OH (US)

(73) Assignee: Case Western Reserve University, Cleveland, OH (US)

( * ) Notice: Subject to any disclaimer, the term of this patent is extended or adjusted under 35 U.S.C. 154(b) by 159 days.

(21) Appl. No.: 16/415,474

(22) Filed: May 17, 2019

(65) Prior Publication Data
US 2019/0353731 A1    Nov. 21, 2019

Related U.S. Application Data

(60) Provisional application No. 62/673,826, filed on May 18, 2018.

(51) Int. Cl.
*G01R 33/50* (2006.01)
*G01R 33/54* (2006.01)
(52) U.S. Cl.
CPC ............. *G01R 33/50* (2013.01); *G01R 33/54* (2013.01)

(58) Field of Classification Search
CPC .. G01R 33/448; G01R 33/4828; G01R 33/50; G01R 33/543; G01R 33/56;
(Continued)

(56) References Cited

U.S. PATENT DOCUMENTS

| 8,643,363 B2 * | 2/2014 | Warntjes ................ G01R 33/56 324/309 |
| 8,723,518 B2 | 5/2014 | Seiberlich |

(Continued)

OTHER PUBLICATIONS

Farrelly C, et al. ECG-gated multiecho Dixon fat water separation in cardiac MRI: Advantages over conventional fat-saturated imaging. Am. J. Roentgenol. 2012;199. doi:10.2214/AJR.11.7759.
(Continued)

*Primary Examiner* — Steven L Yeninas
(74) *Attorney, Agent, or Firm* — Quarles & Brady LLP (57) ABSTRACT

A method for quantifying T1, T2 and resonance frequency simultaneously using magnetic resonance fingerprinting (MRF) includes accessing an MRF dictionary using a magnetic resonance imaging (MRI) system. The MRF dictionary is generated by simulating signal evolutions that include associated off-resonance effects for each signal evolution. The method further includes acquiring MRF data from a region of interest in a subject using the MRI system and a MRF pulse sequence having a plurality of radio frequency (RF) excitations and a readout associated with each RF excitation. Each readout includes a plurality of segments and each segment is used to generate a time frame. The method also include comparing the MRF data to the MRF dictionary to identify a plurality of parameters including T1, T2 and resonance frequency for the MRF data and generating a report indicating the at least one of the plurality of parameters of the MRF data.

18 Claims, 8 Drawing Sheets

(58) Field of Classification Search
CPC ............ G01R 33/5602; G01R 33/5608; G01R 33/4818; G01R 33/4824; G01R 33/54; G01R 33/54543; G01R 33/561
See application file for complete search history.

(56) References Cited

U.S. PATENT DOCUMENTS

| | | | |
|---|---|---|---|
| 2013/0265047 A1* | 10/2013 | Griswold | G01R 33/56 324/309 |
| 2014/0167754 A1* | 6/2014 | Jerecic | G01R 33/56 324/309 |
| 2015/0070012 A1* | 3/2015 | Griswold | G01R 33/56 324/309 |
| 2015/0297101 A1* | 10/2015 | Hernandez-Garcia | A61B 5/0263 600/419 |
| 2015/0301141 A1 | 10/2015 | Griswold | |
| 2015/0346301 A1* | 12/2015 | Cauley | G01R 33/4828 324/309 |
| 2016/0025835 A1* | 1/2016 | Gulani | A61B 5/0035 600/420 |
| 2016/0170065 A1* | 6/2016 | Jain | G01V 3/14 324/303 |
| 2016/0259022 A1* | 9/2016 | Beck | G01R 33/50 |
| 2016/0282430 A1* | 9/2016 | Gulani | G01R 33/4828 |
| 2016/0282434 A1* | 9/2016 | Seiberlich | G01R 33/50 |
| 2019/0025280 A1* | 1/2019 | Kaditz | G16H 30/20 |
| 2019/0025392 A1* | 1/2019 | Chen | A61B 5/7267 |
| 2019/0066297 A1* | 2/2019 | Middlebrooks | G06T 7/0016 |
| 2019/0102516 A1* | 4/2019 | Schieke | G16H 30/40 |

OTHER PUBLICATIONS

Fessler JA. On NUFFT-based gridding for non-Cartesian MRI. J. Magn. Reson. 2007;188:191-195. doi:10.1016/j.jmr.2007.06.012.

Hamilton JI, et al. MR fingerprinting for rapid quantification of myocardial T1, T2, and proton spin density. Magn. Reson. Med. 2017; 77(40: 1446-1458 doi: 10.1002/mrm.26216.

Hussain HK, et al. Hepatic fat fraction: MR imaging for quantitative measurement and display—Early experience. Radiology 2005;237:1048-1055. doi: 10.1148/radiol.2373041639.

Jiang Y, et al. MR fingerprinting using fast imaging with steady state precession (FISP) with spiral readout. Magn. Reson. Med. 2015;74(6): 1621-1631. doi: 10.1002/mrm.25559.

Ma D, et al. Magnetic resonance fingerprinting. Nature 2013;495:187-92. doi: 10.1038/nature11971.

Noll DC. Multishot rosette trajectories for spectrally selective MR imaging. IEEE Trans. Med. Imaging 1997;16:372-7. doi: 10.1109/42.611345.

Pierre EY, et al. Multiscale reconstruction for MR fingerprinting. Magn. Reson. Med. 2016;75:2481-2492. doi: 10.1002/mrm.25776.

Schirda C V, et al. Rosette spectroscopic imaging: optimal parameters for alias-free, high sensitivity spectroscopic imaging. J. Magn. Reson. Imaging 2009;29:1375-85. doi: 10.1002/jmri.21760.

Wissmann L, et al. MRXCAT: Realistic numerical phantoms for cardiovascular magnetic resonance. J. Cardiovasc. Magn. Reson. 2014;16. doi: 10.1186/s12968-014-0063-3.

* cited by examiner

SYSTEM AND METHOD FOR QUANTIFYING T1, T2 AND RESONANCE FREQUENCY USING ROSETTE TRAJECTORY ACQUISITION AND READ SEGMENTED RECONSTRUCTION

CROSS-REFERENCE TO RELATED APPLICATION

This application is based on, claims priority to, and incorporates herein by reference in its entirety U.S. Ser. No. 62/673,826 filed May 18, 2018, and entitled "Multi-Segmented Magnetic Resonance Fingerprinting."

STATEMENT REGARDING FEDERALLY SPONSORED RESEARCH

This invention was made with government support under the grants HL094557 and DK098503 awarded by the National Institutes of Health and the grant 1553441 awarded by the National Science Foundation. The government has certain rights in the invention.

BACKGROUND

Characterizing tissue species using nuclear magnetic resonance ("NMR") can include identifying different properties of a resonant species (e.g., T1 spin-lattice relaxation, T2 spin-spin relaxation, proton density). Other properties like tissue types and super-position of attributes can also be identified using NMR signals. These properties and others may be identified simultaneously using magnetic resonance fingerprinting ("MRF"), which is described, as one example, by D. Ma, et al., in "Magnetic Resonance Fingerprinting," *Nature*, 2013; 495 (7440): 187-192.

Conventional magnetic resonance imaging ("MRI") pulse sequences include repetitive similar preparation phases, waiting phases, and acquisition phases that serially produce signals from which images can be made. The preparation phase determines when a signal can be acquired and determines the properties of the acquired signal. For example, a first pulse sequence may produce a T1-weighted signal at a first echo time ("TE"), while a second pulse sequence may produce a T2-weighted signal at a second TE. These conventional pulse sequences typically provide qualitative results where data are acquired with various weighting or contrasts that highlight a particular parameter (e.g., T1 relaxation, T2 relaxation).

When magnetic resonance ("MR") images are generated, they may be viewed by a radiologist and/or surgeon who interprets the qualitative images for specific disease signatures. The radiologist may examine multiple image types (e.g., T1-weighted, T2 weighted) acquired in multiple imaging planes to make a diagnosis. The radiologist or other individual examining the qualitative images may need particular skill to be able to assess changes from session to session, from machine to machine, and from machine configuration to machine configuration.

Unlike conventional MRI, MRF employs a series of varied sequence blocks that simultaneously produce different signal evolutions in different resonant species (e.g., tissues) to which the radio frequency ("RF") is applied. The signals from different resonant tissues will, however, be different and can be distinguished using MRF. The different signals can be collected over a period of time to identify a signal evolution for the volume. Resonant species in the volume can then be characterized by comparing the signal evolution to known signal evolutions. Characterizing the resonant species may include identifying a material or tissue type, or may include identifying MR parameters associated with the resonant species. The "known" evolutions may be, for example, simulated evolutions calculated from physical principles and/or previously acquired evolutions. A large set of known evolutions may be stored in a dictionary.

Artifacts due to off-resonance effects are a significant challenge for non-Cartesian MRI. In addition to B0 field inhomogeneity, fat signals are a dominant source of off-resonance artifacts. However, resonance frequency information can be used for fat-water separation, which is valuable in various clinical applications, such as diagnosis of bone marrow diseases, hepatic steatosis, pericarditis and evaluation of myocardial lipomatous infiltration. MRF may use a balanced steady-state free precession (bSSFP) sequence, which is sensitive to off-resonance effects but may also result in banding artifacts. Fast imaging with steady-state free precession (FISP)-based MRF has been shown to be relatively insensitive to off-resonance effects due to the gradient spoiler applied at the end of each repetition time (TR). If the entire spiral read-out is employed to generate a highly undersampled image, any off-resonance during the readout will lead to blurring but not banding artifacts. However, short portions of the readout will be mostly free of dephasing due to off-resonance effects.

It would be desirable to provide a system and method for quantifying T1, T2 and resonance frequency simultaneously using magnetic resonance fingerprinting.

SUMMARY OF THE DISCLOSURE

In accordance with an embodiment, a method for quantifying T1, T2 and resonance frequency simultaneously using magnetic resonance fingerprinting (MRF) includes accessing an MRF dictionary using a magnetic resonance imaging (MRI) system. The MRF dictionary is generated by simulating signal evolutions that include associated off-resonance effects for each signal evolution. The method further includes acquiring MRF data from a region of interest in a subject using the MRI system and a MRF pulse sequence having a plurality of radio frequency (RF) excitations and a readout associated with each RF excitation. Each readout includes a plurality of segments and each segment is used to generate a time frame. The method also include comparing the MRF data to the MRF dictionary to identify a plurality of parameters including T1, T2 and resonance frequency for the MRF data and generating a report indicating the at least one of the plurality of parameters of the MRF data.

In accordance with another embodiment, a magnetic resonance fingerprinting (MRF) system includes a magnet system configured to generate a polarizing magnetic field about at least a portion of a subject, a magnetic gradient system including a plurality of magnetic gradient coils configured to apply at least one magnetic gradient field to the polarizing magnetic field and a radio frequency (RF) system configured to apply an RF field to the subject and to receive magnetic resonance signals from the subject using a coil array. The system also includes a computer system programmed to access an MRF dictionary where the MRF dictionary is generated by simulating signal evolutions that include associated off-resonance effects for each signal evolution and acquire MRF data from a region of interest in a subject a MRF pulse sequence having a plurality of radio frequency (RF) excitations and a readout associated with each RF excitation. Each readout includes a plurality of segments and each segment is used to generate a time frame. The computer system is also programmed to compare the MRF data to the MRF dictionary to identify a plurality of parameters including T1, T2 and resonance frequency for the MRF data and generate a report indicating the at least one of the plurality of parameters of the MRF data.

BRIEF DESCRIPTION OF THE DRAWINGS

The present invention will hereafter be described with reference to the accompanying drawings, wherein like reference numerals denote like elements.

DETAILED DESCRIPTION

Magnetic resonance fingerprinting ("MRF") is a technique that facilitates mapping of tissue or other material properties based on random or pseudorandom measurements of the subject or object being imaged. In particular, MRF can be conceptualized as employing a series of varied "sequence blocks" that simultaneously produce different signal evolutions in different "resonant species" to which the RF is applied. The term "resonant species," as used herein, refers to a material, such as water, fat, bone, muscle, soft tissue, and the like, that can be made to resonate using NMR. By way of illustration, when radio frequency ("RF") energy is applied to a volume that has both bone and muscle tissue, then both the bone and muscle tissue will produce a nuclear magnetic resonance ("NMR") signal; however, the "bone signal" represents a first resonant species and the "muscle signal" represents a second resonant species, and thus the two signals will be different. These different signals from different species can be collected simultaneously over a period of time to collect an overall "signal evolution" for the volume.

The measurements obtained in MRF techniques are achieved by varying the acquisition parameters from one repetition time ("TR") period to the next, which creates a time series of signals with varying contrast. Examples of acquisition parameters that can be varied include flip angle ("FA"), RF pulse phase, TR, echo time ("TE"), and sampling patterns, such as by modifying one or more readout encoding gradients. The acquisition parameters are varied in a random manner, pseudorandom manner, or other manner that results in signals from different materials or tissues to be spatially incoherent, temporally incoherent, or both. For example, in some instances, the acquisition parameters can be varied according to a non-random or non-pseudorandom pattern that otherwise results in signals from different materials or tissues to be spatially incoherent, temporally incoherent, or both.

From these measurements, which as mentioned above may be random or pseudorandom, or may contain signals from different materials or tissues that are spatially incoherent, temporally incoherent, or both, MRF processes can be designed to map any of a wide variety of parameters. Examples of such parameters that can be mapped may include, but are not limited to, longitudinal relaxation time ($T_1$), transverse relaxation time ($T_2$), main or static magnetic field map ($B_0$), and proton density ($\rho$). MRF is generally described in U.S. Pat. No. 8,723,518 and Published U.S. Patent Application No. 2015/0301141, each of which is incorporated herein by reference in its entirety.

The data acquired with MRF techniques are compared with a dictionary of signal models, or templates, that have been generated for different acquisition parameters from magnetic resonance signal models, such as Bloch equation-based physics simulations. This comparison allows estimation of the physical parameters, such as those mentioned above. As an example, the comparison of the acquired signals to a dictionary can be performed using any suitable matching or pattern recognition technique. The parameters for the tissue or other material in a given voxel are estimated to be the values that provide the best signal template matching. For instance, the comparison of the acquired data with the dictionary can result in the selection of a signal vector, which may constitute a weighted combination of signal vectors, from the dictionary that best corresponds to the observed signal evolution. The selected signal vector includes values for multiple different quantitative parameters, which can be extracted from the selected signal vector and used to generate the relevant quantitative parameter maps.

The stored signals and information derived from reference signal evolutions may be associated with a potentially very large data space. The data space for signal evolutions can be partially described by:

$$SE = \sum_{s=1}^{N_S} \prod_{i=1}^{N_A} \sum_{j=1}^{N_{RF}} R_i(\alpha) R_{RF_{ij}}(\alpha, \phi) R(G) E_i(T_1, T_2, D) M_0; \quad (1)$$

where SE is a signal evolution; $N_S$ is a number of spins; $N_A$ is a number of sequence blocks; $N_{RF}$ is a number of RF pulses in a sequence block; $\alpha$ is a flip angle; $\phi$ is a phase angle; $R_i(\alpha)$ is a rotation due to off resonance; $R_{RF_{ij}}(\alpha, \phi)$ is a rotation due to RF differences; $R(G)$ is a rotation due to a magnetic field gradient; $T_1$ is a longitudinal, or spin-lattice, relaxation time; $T_2$ is a transverse, or spin-spin, relaxation time; D is diffusion relaxation; $E_i(T_1, T_2, D)$ is a signal decay due to relaxation differences; and $M_0$ is the magnetization in the default or natural alignment to which spins align when placed in the main magnetic field.

While $E_i$ ($T_1$, $T_2$, D) is provided as an example, in different situations, the decay term, $E_i$ ($T_1$, $T_2$, D), may also include additional terms, $E_i$ ($T_1$, $T_2$, D . . . ) or may include fewer terms, such as by not including the diffusion relaxation, as $E_i$ ($T_1$, $T_2$) or $E_i$($T_1$, $T_2$, . . . ). Also, the summation on "j" could be replace by a product on "j". The dictionary may store signals described by, $$S_i = R_i E_i(S_{i-1}) \qquad (2);$$

where $S_0$ is the default, or equilibrium, magnetization; $S_i$ is a vector that represents the different components of magnetization, $M_x$, $M_y$, and $M_z$ during the $i^{th}$ acquisition block; $R_i$ is a combination of rotational effects that occur during the $i^{th}$ acquisition block; and $E_i$ is a combination of effects that alter the amount of magnetization in the different states for the $i^{th}$ acquisition block. In this situation, the signal at the $i^{th}$ acquisition block is a function of the previous signal at acquisition block (i.e., the $(i-1)^{th}$ acquisition block). Additionally or alternatively, the dictionary may store signals as a function of the current relaxation and rotation effects and of previous acquisitions. Additionally or alternatively, the dictionary may store signals such that voxels have multiple resonant species or spins, and the effects may be different for every spin within a voxel. Further still, the dictionary may store signals such that voxels may have multiple resonant species or spins, and the effects may be different for spins within a voxel, and thus the signal may be a function of the effects and the previous acquisition blocks.

Thus, in MRF, a unique signal timecourse is generated for each pixel. This timecourse evolves based on both physiological tissue properties such as T1 or T2 as well as acquisition parameters like flip angle (FA) and repetition time (TR). This signal timecourse can, thus, be referred to as a signal evolution and each pixel can be matched to an entry in the dictionary, which is a collection of possible signal evolutions or timecourses calculated using a range of possible tissue property values and knowledge of the quantum physics that govern the signal evolution. Upon matching the measured signal evolution/timecourse to a specific dictionary entry, the tissue properties corresponding to that dictionary entry can be identified. A fundamental criterion in MRF is that spatial incoherence be maintained to help separate signals that are mixed due to undersampling. In other words, signals from various locations should differ from each other, in order to be able to separate them when aliased.

Figure 1:
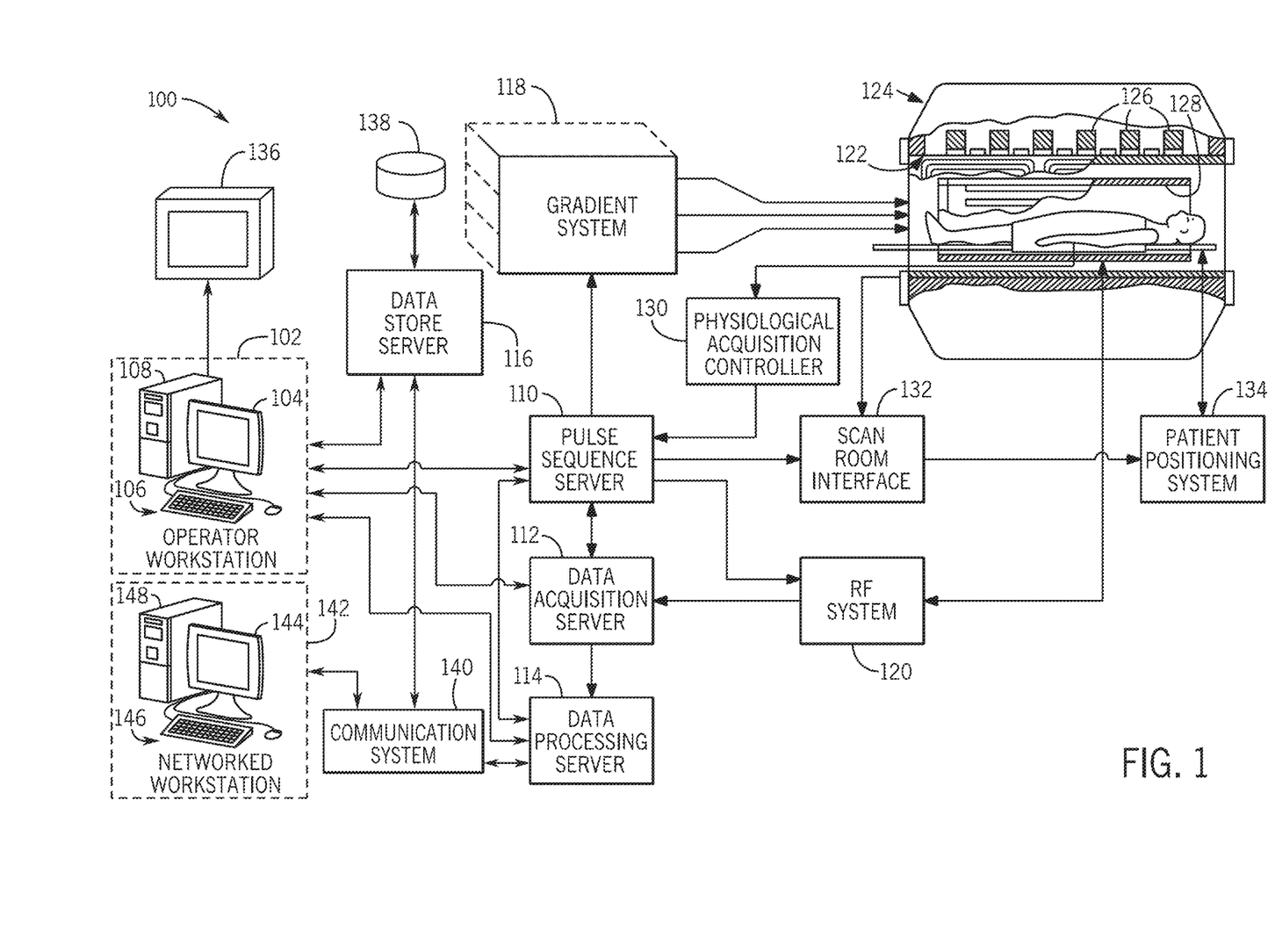
FIG. 1 is a schematic diagram of an example MRI system in accordance with an embodiment.

To achieve this process, a magnetic resonance imaging (MRI) system or nuclear magnetic resonance (NMR) system may be utilized. FIG. 1 shows an example of an MRI system 100 that may be used to perform magnetic resonance fingerprinting. In addition, MRI system 100 may be used to implement the methods described herein. MRI system 100 includes an operator workstation 102, which may include a display 104, one or more input devices 106 (e.g., a keyboard, a mouse), and a processor 108. The processor 108 may include a commercially available programmable machine running a commercially available operating system. The operator workstation 102 provides an operator interface that facilitates entering scan parameters into the MRI system 100. The operator workstation 102 may be coupled to different servers, including, for example, a pulse sequence server 110, a data acquisition server 112, a data processing server 114, and a data store server 116. The operator workstation 102 and the servers 110, 112, 114, and 116 may be connected via a communication system 140, which may include wired or wireless network connections.

The pulse sequence server 110 functions in response to instructions provided by the operator workstation 102 to operate a gradient system 118 and a radiofrequency ("RF") system 120. Gradient waveforms for performing a prescribed scan are produced and applied to the gradient system 118, which then excites gradient coils in an assembly 122 to produce the magnetic field gradients $G_x$, $G_y$, and $G_z$ that are used for spatially encoding magnetic resonance signals. The gradient coil assembly 122 forms part of a magnet assembly 124 that includes a polarizing magnet 126 and a whole-body RF coil 128.

RF waveforms are applied by the RF system 120 to the RF coil 128, or a separate local coil to perform the prescribed magnetic resonance pulse sequence. Responsive magnetic resonance signals detected by the RF coil 128, or a separate local coil, are received by the RF system 120. The responsive magnetic resonance signals may be amplified, demodulated, filtered, and digitized under direction of commands produced by the pulse sequence server 110. The RF system 120 includes an RF transmitter for producing a wide variety of RF pulses used in MRI pulse sequences. The RF transmitter is responsive to the prescribed scan and direction from the pulse sequence server 110 to produce RF pulses of the desired frequency, phase, and pulse amplitude waveform. The generated RF pulses may be applied to the whole-body RF coil 128 or to one or more local coils or coil arrays.

The RF system 120 also includes one or more RF receiver channels. An RF receiver channel includes an RF preamplifier that amplifies the magnetic resonance signal received by the coil 128 to which it is connected, and a detector that detects and digitizes the I and Q quadrature components of the received magnetic resonance signal. The magnitude of the received magnetic resonance signal may, therefore, be determined at a sampled point by the square root of the sum of the squares of the I and Q components:

$$M = \sqrt{I^2 + Q^2} \qquad (3);$$

and the phase of the received magnetic resonance signal may also be determined according to the following relationship:

$$\varphi = \tan^{-1}\left(\frac{Q}{I}\right). \qquad (4)$$

The pulse sequence server 110 may receive patient data from a physiological acquisition controller 130. By way of example, the physiological acquisition controller 130 may receive signals from a number of different sensors connected to the patient, including electrocardiograph ("ECG") signals from electrodes, or respiratory signals from a respiratory bellows or other respiratory monitoring devices. These signals may be used by the pulse sequence server 110 to synchronize, or "gate," the performance of the scan with the subject's heart beat or respiration.

The pulse sequence server 110 may also connect to a scan room interface circuit 132 that receives signals from various sensors associated with the condition of the patient and the magnet system. Through the scan room interface circuit 132, a patient positioning system 134 can receive commands to move the patient to desired positions during the scan.

The digitized magnetic resonance signal samples produced by the RF system 120 are received by the data acquisition server 112. The data acquisition server 112 operates in response to instructions downloaded from the operator workstation 102 to receive the real-time magnetic resonance data and provide buffer storage, so that data is not lost by data overrun. In some scans, the data acquisition server 112 passes the acquired magnetic resonance data to the data processor server 114. In scans that require information derived from acquired magnetic resonance data to control the further performance of the scan, the data acquisition server 112 may be programmed to produce such information and convey it to the pulse sequence server 110.

For example, during pre-scans, magnetic resonance data may be acquired and used to calibrate the pulse sequence performed by the pulse sequence server 110. As another example, navigator signals may be acquired and used to adjust the operating parameters of the RF system 120 or the gradient system 118, or to control the view order in which k-space is sampled. In still another example, the data acquisition server 112 may also process magnetic resonance signals used to detect the arrival of a contrast agent in a magnetic resonance angiography ("MRA") scan. For example, the data acquisition server 112 may acquire magnetic resonance data and processes it in real-time to produce information that is used to control the scan.

The data processing server 114 receives magnetic resonance data from the data acquisition server 112 and processes the magnetic resonance data in accordance with instructions provided by the operator workstation 102. Such processing may include, for example, reconstructing two-dimensional or three-dimensional images by performing a Fourier transformation of raw k-space data, performing other image reconstruction algorithms (e.g., iterative or backprojection reconstruction algorithms), applying filters to raw k-space data or to reconstructed images, generating functional magnetic resonance images, or calculating motion or flow images.

Images reconstructed by the data processing server 114 are conveyed back to the operator workstation 102 for storage. Real-time images may be stored in a data base memory cache, from which they may be output to operator display 102 or a display 136. Batch mode images or selected real time images may be stored in a host database on disc storage 138. When such images have been reconstructed and transferred to storage, the data processing server 114 may notify the data store server 116 on the operator workstation 102. The operator workstation 102 may be used by an operator to archive the images, produce films, or send the images via a network to other facilities.

The MRI system 100 may also include one or more networked workstations 142. For example, a networked workstation 142 may include a display 144, one or more input devices 146 (e.g., a keyboard, a mouse), and a processor 148. The networked workstation 142 may be located within the same facility as the operator workstation 102, or in a different facility, such as a different healthcare institution or clinic.

The networked workstation 142 may gain remote access to the data processing server 114 or data store server 116 via the communication system 140. Accordingly, multiple networked workstations 142 may have access to the data processing server 114 and the data store server 116. In this manner, magnetic resonance data, reconstructed images, or other data may be exchanged between the data processing server 114 or the data store server 116 and the networked workstations 142, such that the data or images may be remotely processed by a networked workstation 142.

Figure 2:
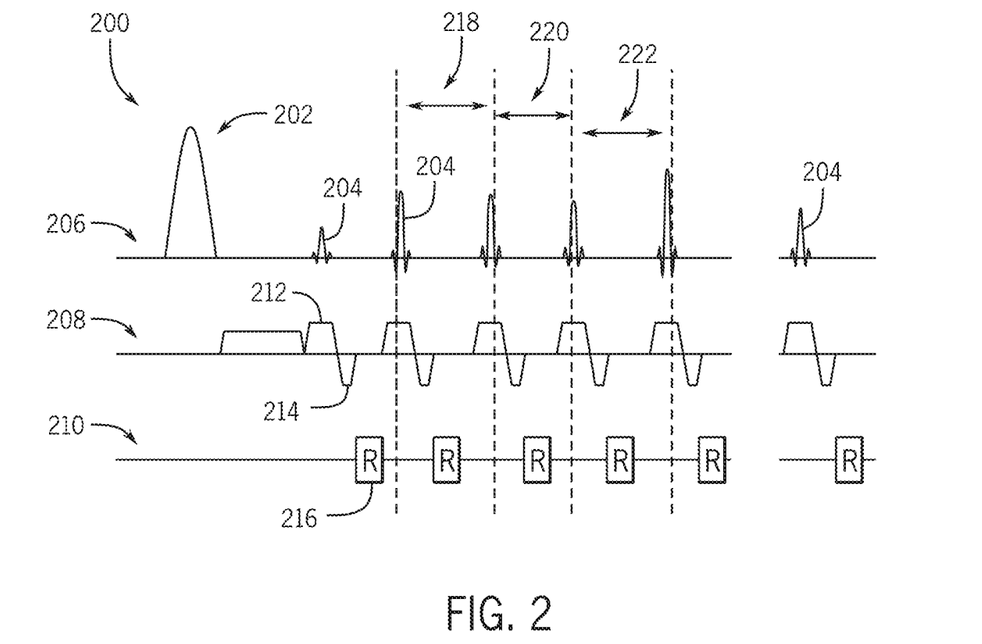
FIG. 2 illustrates an example FISP-MRF pulse sequence in accordance with an embodiment.

As mentioned above, for MRF a pulse sequence may be performed using a series of varied sequence blocks to elicit MR signals (and signal evolutions) from each image element (e.g., pixel or voxel) from a region of interest. FIG. 2 illustrates an example fast imaging with steady-state free precession (FIP) MRF pulse sequence in accordance with an embodiment. The FISP-MRF pulse sequence 200 includes a radio frequency (RF) inversion pulse 202 $m$ the RF energy 206 applied. While an inversion pulse is illustrated, in difference embodiments, there may or may not be an inversion recovery period. A slice select gradient 212 is applied in the slice selection direction 208 at the same time as an RF pulse 204. The FISP-MRF pulse sequence 200 includes an unbalanced slice select gradient. While the slice select gradient is illustrated as being unbalanced, in difference embodiments, other gradients (e.g., x, y, z phase encoding, frequency encoding, readout encoding) may be unbalanced. The unbalanced slice select gradient dephases transverse magnetization produced during MRF of the subject. In one embodiment, other than T2 and T2* decay, only the unbalanced slice select gradient dephases the transverse magnetization. Controlling the dephasing of transverse magnetization in this manner improves immunity to artifacts or other distortions caused by an imperfect B0. A readout 216 is applied in a readout direction 210. Data is acquired during an acquisition period (e.g., acquisition periods 218, 220, 222) after the application of an RF pulse 204. Each acquisition period 218, 220, 222 corresponds to a repetition time (TR) which is the time between successive RF pulses 204. In the FISP-MRF pulse sequence 200, the acquisition periods 218, 220, 222 do not have to be of equal duration.

The FISP-MRF pulse sequence 200 may be manipulated to generate different contrast by varying, for example, flip angles or repetition times (TR) used in the FISP-MRF pulse sequence 200. Thus, in one embodiment, to generate unique signal shapes for different tissue types that may be examined using FISP-MRF, the flip angle or repetition time may be varied in different acquisition periods. In one embodiment, a flip angle or repetition time may be varied from one acquisition period to the next.

Figure 3:
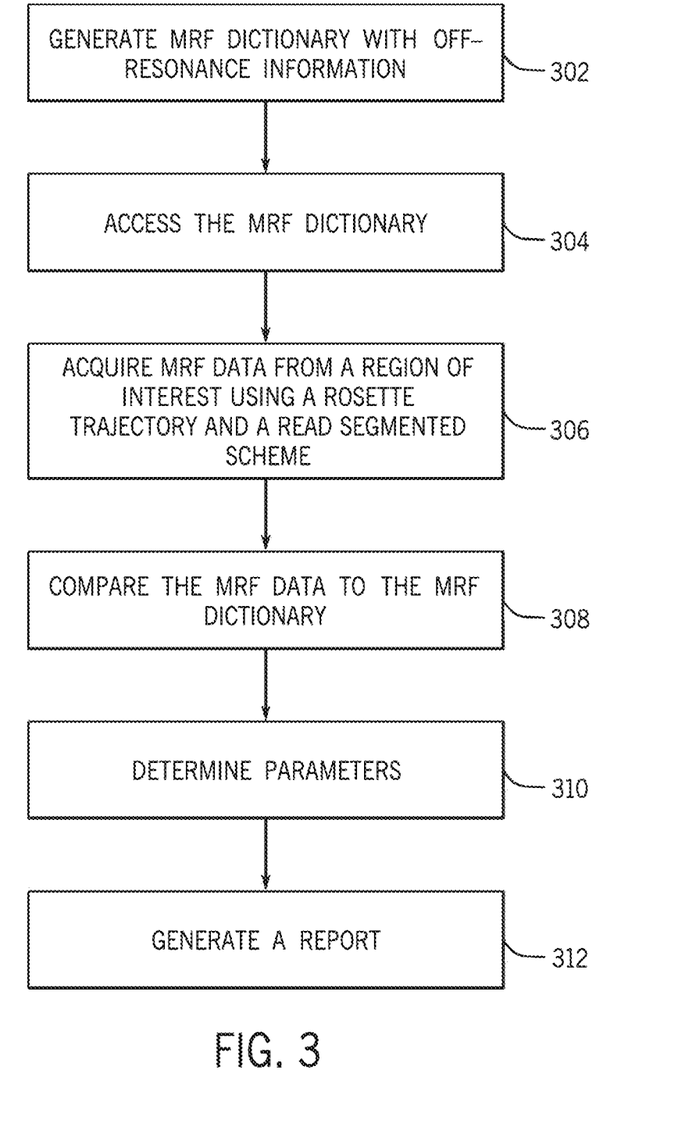
FIG. 3 illustrates a method for magnetic resonance fingerprinting using a rosette trajectory acquisition and read segmented reconstruction in accordance with an embodiment.

The present disclosure describes a system and method for quantifying T1, T2 and resonance frequency simultaneously based on a FISP-MRF sequence framework. Off-resonance information (including fat/water discrimination) can be retrieved along with T1 and T2 values by considering the effects of off-resonance during an MRF readout. FIG. 3 illustrates a method for magnetic resonance fingerprinting with a rosette trajectory acquisition and read segmented reconstruction in accordance with an embodiment. At block 302, a MRF dictionary is generated that includes, among other parameters such as T1 and T2, off-resonance information. The MRF dictionary includes known signal evolutions (e.g., simulated signal evolutions). In an embodiment, the MRF dictionary may be generated using a Bloch simulation. Signal evolutions over excitations as well as within one excitation over a plurality of segments of the readout may be simulated to incorporate off-resonance information. The MRF dictionary may be stored in memory or data storage of, for example, an MRI system (e.g., the MRI system 100 of FIG. 1) or other computer system. At block 304, the MRF dictionary is accessed. As used herein, the term "accessing" may refer to any number of activities related to retrieving or processing the MRF dictionary using, for example, MRI system 100 (shown in FIG. 1), an external network, information repository, or combinations thereof.

Figure 4A:
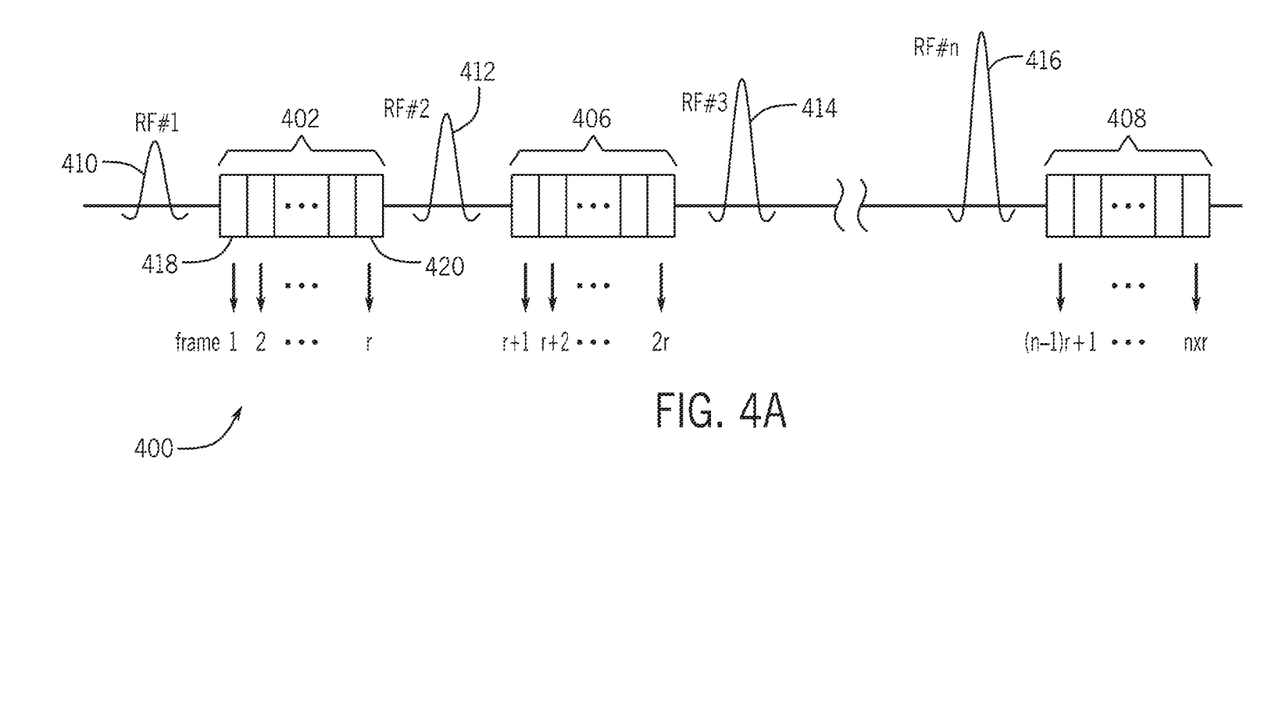
FIG. 4A illustrates a portion of a FISP-MRF pulse sequence with a read segmented scheme in accordance with an embodiment.
Figure 4B:
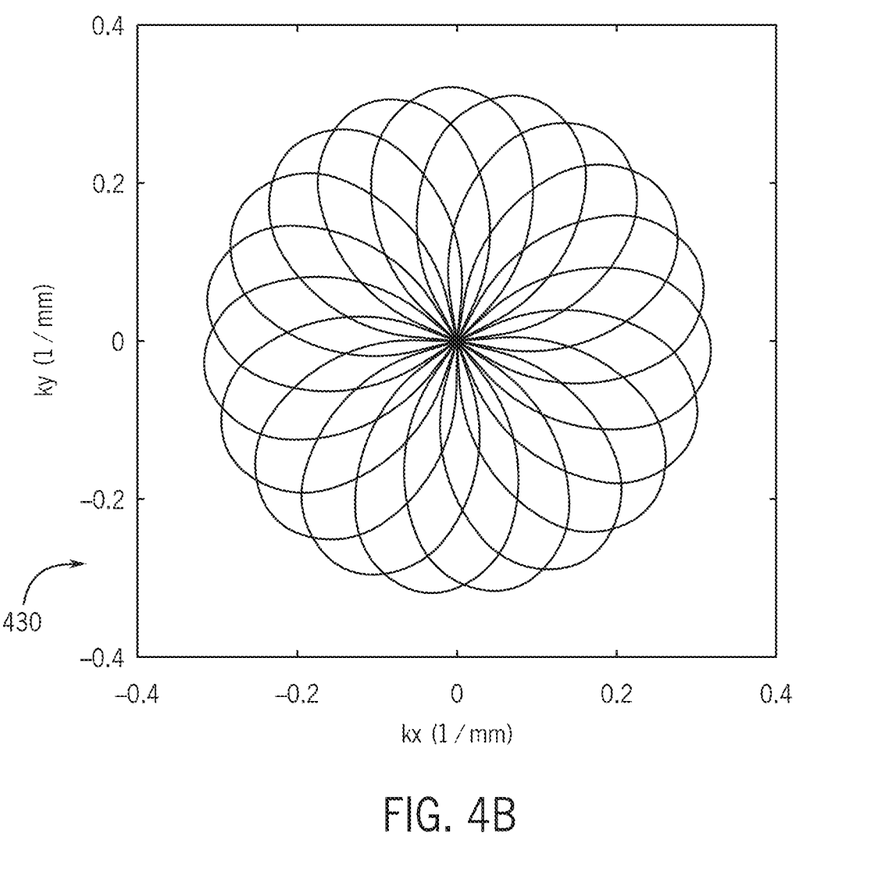
FIG. 4B shows a rosette trajectory in accordance with an embodiment.

At block 306, MRF data is acquired from tissue in a region of interest using an acquisition with a rosette trajectory and reconstruction using a read segmented scheme. The MRF data may be acquired using, for example, an MRI system (e.g., MRI system 100 shown in FIG. 1) and using a pulse sequence such as, for example, a FISP-MRF pulse sequence. As mentioned, a rosette data collection trajectory and a read segmented scheme are used in the disclosed MRF technique. By reconstructing images using only segments of the readout, and not the entire readout, the resonance frequency may be quantified along with T1 and T2. FIG. 4A illustrates a portion of a MRF pulse sequence with a read segmented scheme in accordance with an embodiment and FIG. 4B shows a rosette trajectory in accordance with an embodiment. To measure off-resonance effects, the signal evolution is modeled both during a readout time within one RF excitation, as well as over multipole excitations. In FIG. 4A, "n" is the number of excitations (RF pulses) in total and "r" is the number of segments within one repetition time (TR). A first readout 402 is shown after a first RF pulse 410, a second readout 406 is shown after a second RF pulse 412, a third readout (not shown) occurs after a third RF pulse 414 and an $n^{th}$ readout 408 is shown after an $n^{th}$ RF pulse 416. Each readout 402, 406, 408 is divided into multiple segments. For example, the first readout 402 is divided into r segments including a first segment 418 and an $r^{th}$ segment 420. The second readout 406 is divided in to r segments from segment r+1 to segment 2r. The $n^{th}$ readout 408 is divided into r segments from segment (n+1)r+1 to segment n×r. Accordingly the interleaf is divided into smaller segments and a time frame is generated for each segment. By dividing data points acquired during one excitation (or TR) into multiple segments, the dephasing between water and fat is sufficiently small during one segment and the number of segments within one excitation is adequate to model off-resonance accumulation.

In an embodiment, the rosette trajectory 430 shown in FIG. 4B may be used to sample data in the center of k-space frequently. The rosette trajectory 430 allows the sampling of the center of k-space more frequently when fewer points are gridded to generate each undersampled image. The rosette trajectory 430 incudes a plurality of readout points in one interleaf and a plurality of zero crossings. In an embodiment, the rosette trajectory 430 allows for retrospective data reconstruction at either water or fat resonance frequency due to it multiple zero-crossings in k-space. If the k-space data is acquired with water on-resonance (which is the most common case), the k-space data could be shifted to fat on-resonance simply by multiplying a phase term that compensates the off-resonance accumulation of fat during the readout period. The design of the rosette trajectory may allow for significant suppression of water signal when data are reconstructed under fat resonance frequency, and vice versa. Accordingly, separate water images and fat images may be reconstructed from one scan if the readout timing and chemical shift of water and fat are known.

Returning to FIG. 3, the MRF data acquired at block 306 is stored and compared to the MRF dictionary at block 308 to match the acquired signal evolutions with signal evolutions stored in the MRF dictionary. Comparing the MRF data to the MRF dictionary may be performed in a number of ways such as, for example, using a pattern matching, template matching or other matching algorithm. In one embodiment, dot product pattern matching may be used to select the MRF dictionary entry which most closely fits the acquired signal evolutions to extract T1, T2, and off-resonance values for each pixel. In another embodiment, iterative pattern matching may be used. At block 310, one or more parameters of the MRF data are determined based on the comparison and matching at block 308. As described above, the parameters may include longitudinal relaxation time (T1), transverse relaxation time (T2) and resonance frequency. In an embodiment, other parameters may be determined such as main or static magnetic field ($B_0$) and proton density (PD). In an embodiment, multi-scale reconstruction may be used to improve accuracy of off-resonance mapping. At block 312, a report may be generated indicating at least one of the identified parameters for the tissue in a region of interest in a subject. For example, the report may include a quantitative indication of the at least one parameter. The report may include, for example, images or maps, text or metric based reports, audio reports and the like. The report may be provided to a display (e.g., display 104, 136 or 144 shown in FIG. 1).

In an example, the read segmented MRF technique described herein was evaluated using an open-source numerical cardiac phantom. The phantom was modified to have T1 and T2 values corresponding to those of the heart at 1.5 T, with T1 values from 250 ms to 1200 ms, T2 values from 20 ms to 100 ms, and off-resonance values of 0 and −220 Hz representing water and fat, respectively. B0 field inhomogeneity was simulated arbitrarily as a linear variation from −50 Hz to 50 Hz from left to right. In this example, a rosette trajectory was designed with 1700 readout points in one interleaf and nineteen zero crossings. A total of 48 excitations were acquired every heartbeat. The scan duration was 15 heartbeats, and a constant heart rate of 60 bpm was simulated. The rosette interleaf was rotated by the golden angle (111°) between excitations. In this example, inversion and T2 preparation pulses were employed as in a cardiac FISP-MRF pulse sequence. Linearly varying flip angles were employed with the minimal flip angle of 4° and the maximal flip angles of 12°, 18°, 25°, 25°, and 25° for every five successive heart beats. A constant TR and a constant echo time (TE) of 5.1 and 1.39 ms, respectively, was used. Other parameters were a 300×300 mm2 field of view; and a 192×192 matrix.

In this example, each rosette interleaf was divided into 85 groups of 20 readout points each, which were gridded to form a highly undersampled image using non-uniform Fast Fourier transforms (NUFFT). Thus, in this example 61200 images (48×15×85) were available for T1, T2, and off-resonance quantification. Images were reconstructed by gridding every 20 points. It was found that dephasing between water and fat within the duration of a 20-point segment was 0.02 π and thus negligible. For dictionary generation, a Bloch simulation was performed using an isochromat of 100 spins. Signal evolutions not only over excitations but also within one excitation over the 85 segments were simulated to incorporate off-resonance information. In this example, the MRF signal was calculated by taking a complex average of the transverse magnetization over the entire isochromat. The dictionary resolution, denoted by min:step:max, was T1 [190:20:400, 700:20:1000, 1100:20:1300] ms, T2 [10:5:60, 90:10:110] ms, off-resonance [−50:5:50, −280:10:−160] Hz. The dictionary had a total of 18088 entries. Unrealistic pairs of T1 and T2 were not simulated, including T2>T1. Dot product pattern matching was performed to select the MRF dictionary entry which most closely fit the acquired signal time courses to extract T1, T2 and off-resonance values for each pixel. In another example, a multi-scale reconstruction approach was used to improve the accuracy of off-resonance mapping.

As mentioned above, separate water images and fat images may be reconstructed from one scan using the MRF technique with a rosette trajectory if the readout timing and chemical shift of water and fat are known. In another example, multiple-compartment water and oil phantom experiments were performed at 3 T using the rosette trajectory MRF technique. The k-space data was acquired using a rosette trajectory with five zero-crossings at water resonance frequency. All acquisition parameters were the same as described above in the previous example except for TR (6.42 ms). Retrospective reconstruction as described above was performed to generate images under water resonance and oil resonance separately. The chemical shift of oil was obtained from the shimming procedure before the acquisition started.

T1, T2, and proton density maps of water and oil were produced from the water image series and oil image series, respectively.

Figure 5:
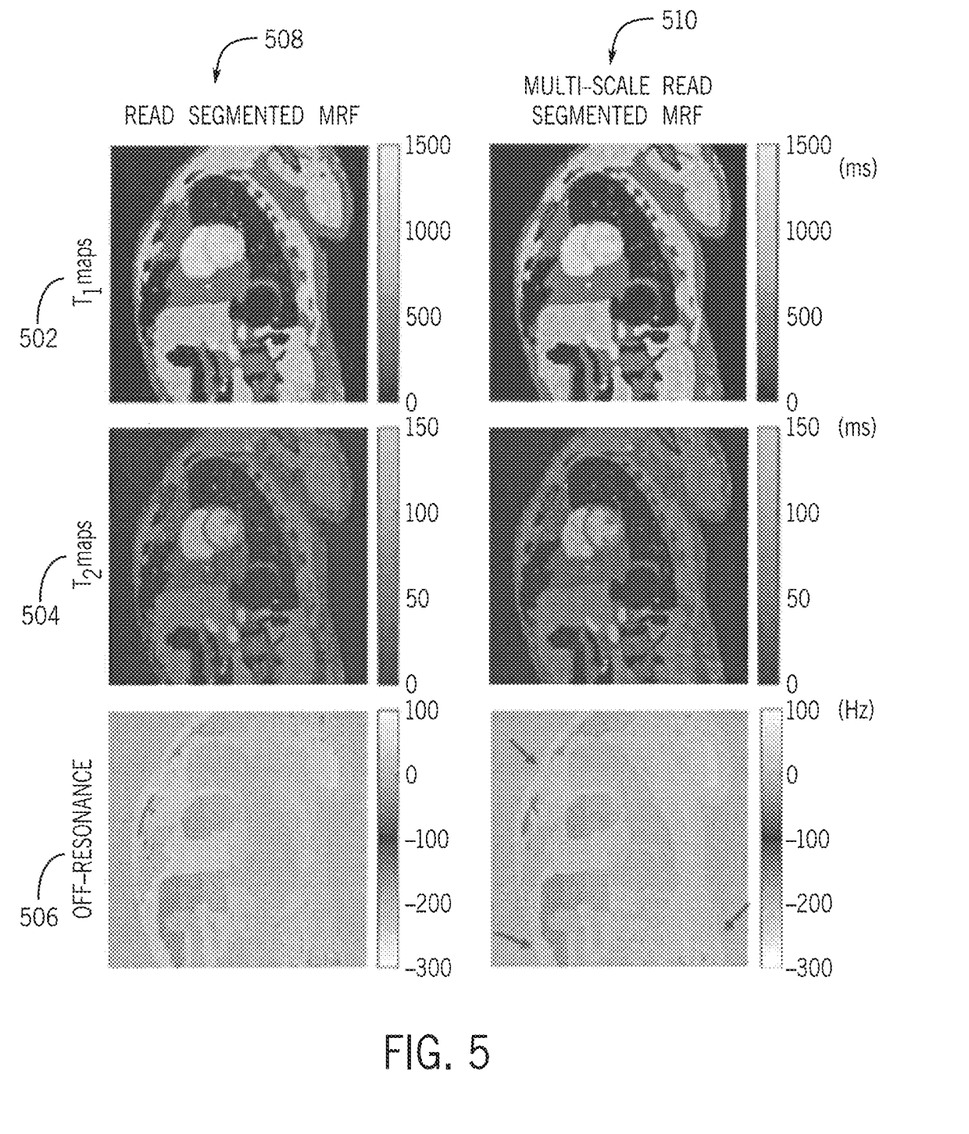
FIG. 5 shows example read segmented MRF maps and multi-scale read segmented MRF maps in accordance with an embodiment.
Figure 6:
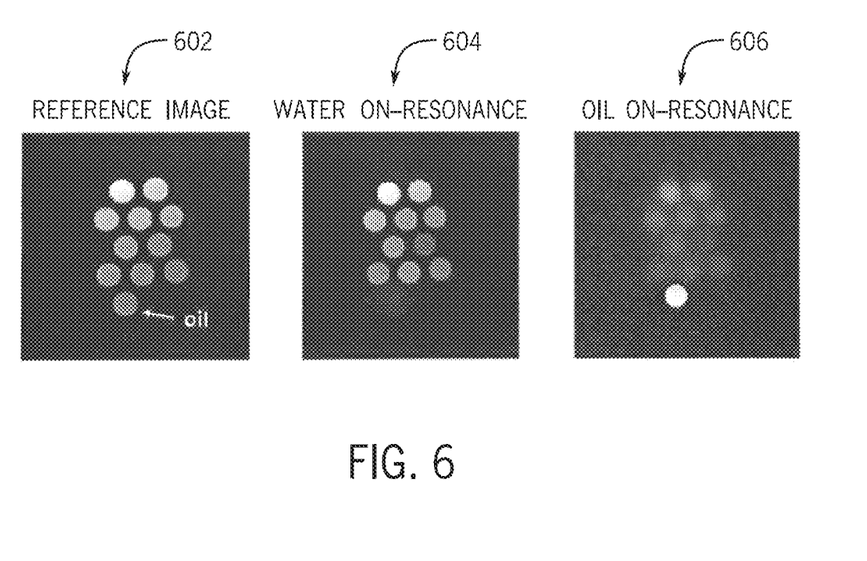
FIG. 6 shows example MRF images summed over all time frames in water and oil phantoms in accordance with an embodiment.
Figure 7:
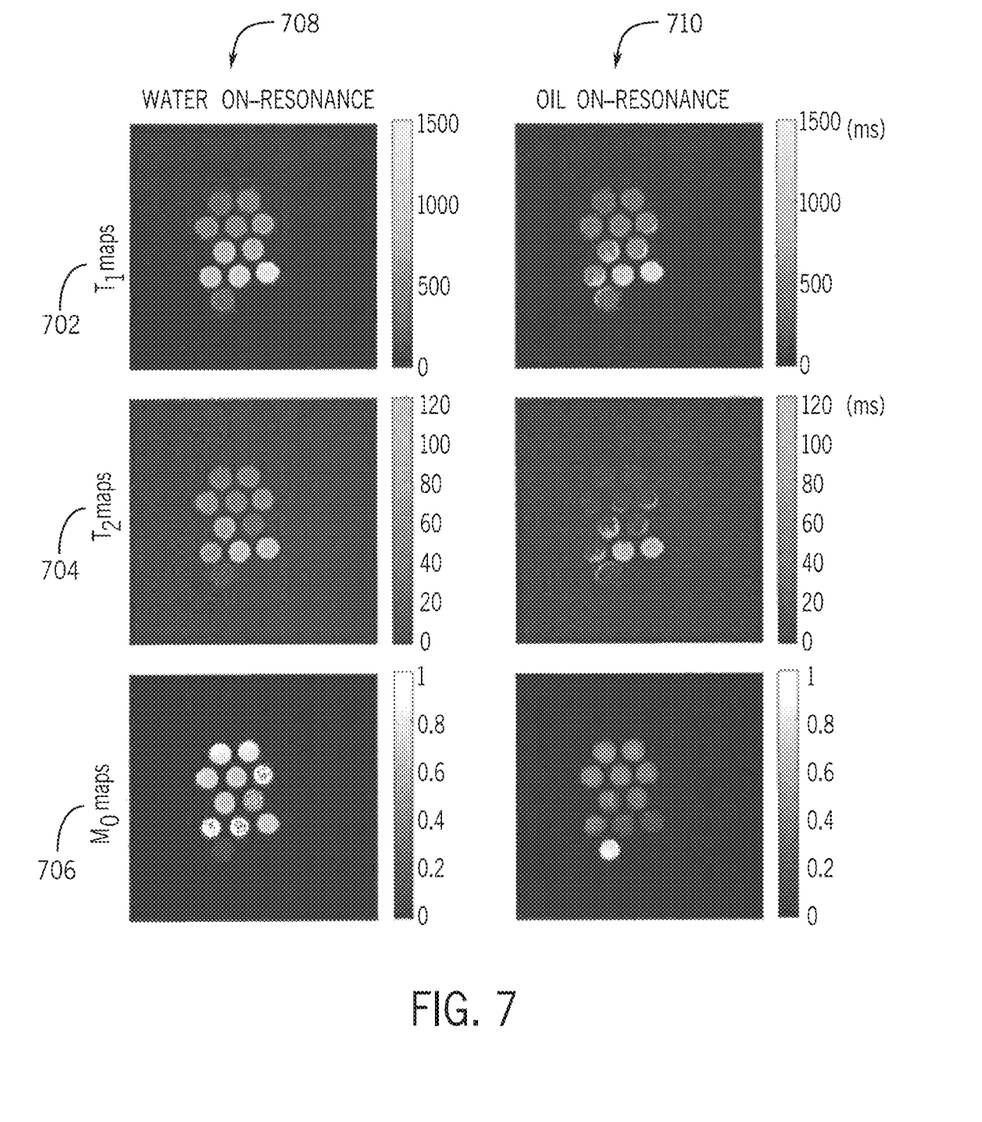
FIG. 7 shows example T1, T2 and proton density maps of water and oil produced from water images and oil images separately in accordance with an embodiment.

FIG. 5 shows example read segmented MRF maps and multi-scale read segmented MRF maps in accordance with an embodiment. FIG. 5 shows example T1 maps 502, T2 maps 504 and off-resonance maps 506 generated using the read segmented MRF 508 and a multi-scale read segmented MRF 510. The accuracy of off-resonance mapping was further improved in multiscale read segmented MRF as indicated by arrows in FIG. 5. In addition to mapping the B0 field inhomogeneity, fat and water can also be distinguished. FIG. 6 shows example MRF images summed over all time frames in water and oil phantoms in accordance with an embodiment. Image 602 is a reference image showing both water and oil compartments. Image 604 was reconstructed with water on-resonance. Image 606 was reconstructed with oil on-resonance. The signal intensity of oil is significantly suppressed when data are reconstructed with water on-resonance. Similarly, water signal is suppressed when data are reconstructed with oil on-resonance. FIG. 7 shows example T1 702, T2 704 and proton density maps 706 of water 708 and oil 710 produced from water images and oil images separately in accordance with an embodiment. In an embodiment, a k-space shift approach to reconstruct separate water and fat images may be used to quantify fat deposition in the heart.

Computer-executable instructions for quantifying T1, T2 and resonance frequency simultaneously using a rosette trajectory acquisition and read segment reconstruction according to the above-described methods may be stored on a form of computer readable media. Computer readable media includes volatile and nonvolatile, removable, and non-removable media implemented in any method or technology for storage of information such as computer readable instructions, data structures, program modules or other data. Computer readable media includes, but is not limited to, random access memory (RAM), read-only memory (ROM), electrically erasable programmable ROM (EEPROM), flash memory or other memory technology, compact disk ROM (CD-ROM), digital volatile disks (DVD) or other optical storage, magnetic cassettes, magnetic tape, magnetic disk storage or other magnetic storage devices, or any other medium which can be used to store the desired instructions and which may be accessed by a system (e.g., a computer), including by internet or other computer network form of access.

The present invention has been described in terms of one or more preferred embodiments, and it should be appreciated that many equivalents, alternatives, variations, and modifications, aside from those expressly states, are possible and within the scope of the invention.

The invention claimed is:

1. A method for quantifying T1, T2 and resonance frequency simultaneously using magnetic resonance fingerprinting (MRF) comprising:
    accessing an MRF dictionary using a magnetic resonance imaging (MRI) system, the MRF dictionary generated by simulating signal evolutions that include associated off-resonance effects for each signal evolution;
    acquiring MRF data from a region of interest in a subject using the MRI system and a MRF pulse sequence having a plurality of radio frequency (RF) excitations and a readout associated with each RF excitation, wherein each readout includes a plurality of segments and each segment comprises a subset of MRF data points acquired during the readout, wherein each segment of the readout is processed separately;
    comparing the MRF data to the MRF dictionary to identify a plurality of parameters including T1, T2 and resonance frequency for the MRF data; and
    generating a report indicating the at least one of the plurality of parameters of the MRF data.

2. The method according to claim 1, wherein comparing the MRF data to the MRF dictionary is further used to separate water and fat for the MRF data.

3. The method according to claim 1, wherein acquiring MRF data further includes sampling k-space using a rosette trajectory.

4. The method according to claim 1, wherein a number of segments in the plurality of segments in a readout is selected to model off-resonance accumulation.

5. The method according to claim 1, wherein the MRF pulse sequence is a FISP (Fast Imaging With Steady State Free Precession) MRF pulse sequence.

6. The method according to claim 1, wherein the MRF dictionary includes signal evolutions that are simulated within at least one readout and over a plurality of readouts.

7. The method according to claim 3, wherein the rosette trajectory is used to sample the center of k-space.

8. The method according to claim 1, wherein the plurality of segments in a readout is configured to control a dephasing between water and fat during a segment.

9. The method according to claim 1, wherein generating a report includes generating quantitative map of the identified resonance frequency.

10. A magnetic resonance fingerprinting (MRF) system comprising:
    a magnet system configured to generate a polarizing magnetic field about at least a portion of a subject;
    a magnetic gradient system including a plurality of magnetic gradient coils configured to apply at least one magnetic gradient field to the polarizing magnetic field;
    a radio frequency (RF) system configured to apply an RF field to the subject and to receive magnetic resonance signals from the subject using a coil array; and
    a computer system programmed to:
        access an MRF dictionary, the MRF dictionary generated by simulating signal evolutions that include associated off-resonance effects for each signal evolution;
        acquire MRF data from a region of interest in a subject using a MRF pulse sequence having a plurality of radio frequency (RF) excitations and a readout associated with each RF excitation, wherein each readout includes a plurality of segments and each segment comprises a subset of MRF data points acquired during the readout, wherein each segment of the readout is processed separately;
        compare the MRF data to the MRF dictionary to identify a plurality of parameters including T1, T2 and resonance frequency for the MRF data; and
        generate a report indicating the at least one of the plurality of parameters of the MRF data.

11. The system according to claim 10, wherein comparing the MRF data to the MRF dictionary is further used to separate water and fat for the MRF data.

12. The system according to claim 10, wherein acquiring MRF data further includes sampling k-space using a rosette trajectory.

13. The system according to claim 10, wherein a number of segments in the plurality of segments in a readout is selected to model off-resonance accumulation.

14. The system according to claim 10, wherein the MRF pulse sequence is a FISP (Fast Imaging With Steady State Free Precession)-MRF pulse sequence.

15. The system according to claim 10, wherein the MRF dictionary includes signal evolutions that are simulated within at least one readout and over a plurality of readouts.

16. The system according to claim 12, wherein the rosette trajectory is used to sample the center of k-space.

17. The system according to claim 10, wherein the plurality of segments in a readout is configured to control a dephasing between water and fat during a segment.

18. The system according to claim 10, wherein generating a report includes generating quantitative map of the identified resonance frequency.

* * * * *